United States Patent [19]

Janko et al.

[11] 4,110,749
[45] Aug. 29, 1978

[54] TOUCH DISPLAY TO DIGITAL ENCODING SYSTEM

[75] Inventors: Bozidar Janko; Aris Silzars, both of Portland, Oreg.

[73] Assignee: Tektronix, Inc., Beaverton, Oreg.

[21] Appl. No.: 794,438

[22] Filed: May 6, 1977

[51] Int. Cl.² .............................................. G08B 5/36
[52] U.S. Cl. ............................ 340/365 C; 340/365 R; 340/365 S; 340/337
[58] Field of Search ............ 340/166 EL, 337, 365 R, 340/365 S, 365 C; 178/18

[56] References Cited

U.S. PATENT DOCUMENTS

| | | | |
|---|---|---|---|
| 3,482,241 | 12/1969 | Johnson | 340/365 C |
| 4,015,254 | 3/1977 | Strandt | 340/365 R |
| 4,020,391 | 4/1977 | Baxter | 340/365 S |

*Primary Examiner*—David L. Trafton
*Attorney, Agent, or Firm*—Adrian J. LaRue; Kenneth M. Durk

[57] ABSTRACT

A system for inputting data into a display device by touch-sensitive contact areas disposed adjacent the display device and including state of the art electronic recognition circuitry associated with the contact areas for synchronously converting the data to discrete elements of information. Specifically, the transparent contact pads are overlayed over a display with each pad coupled with a multiplexer followed by a synchronous quadrature filter function performed by yet another multiplexer in such a manner that data displayed may be altered.

4 Claims, 7 Drawing Figures

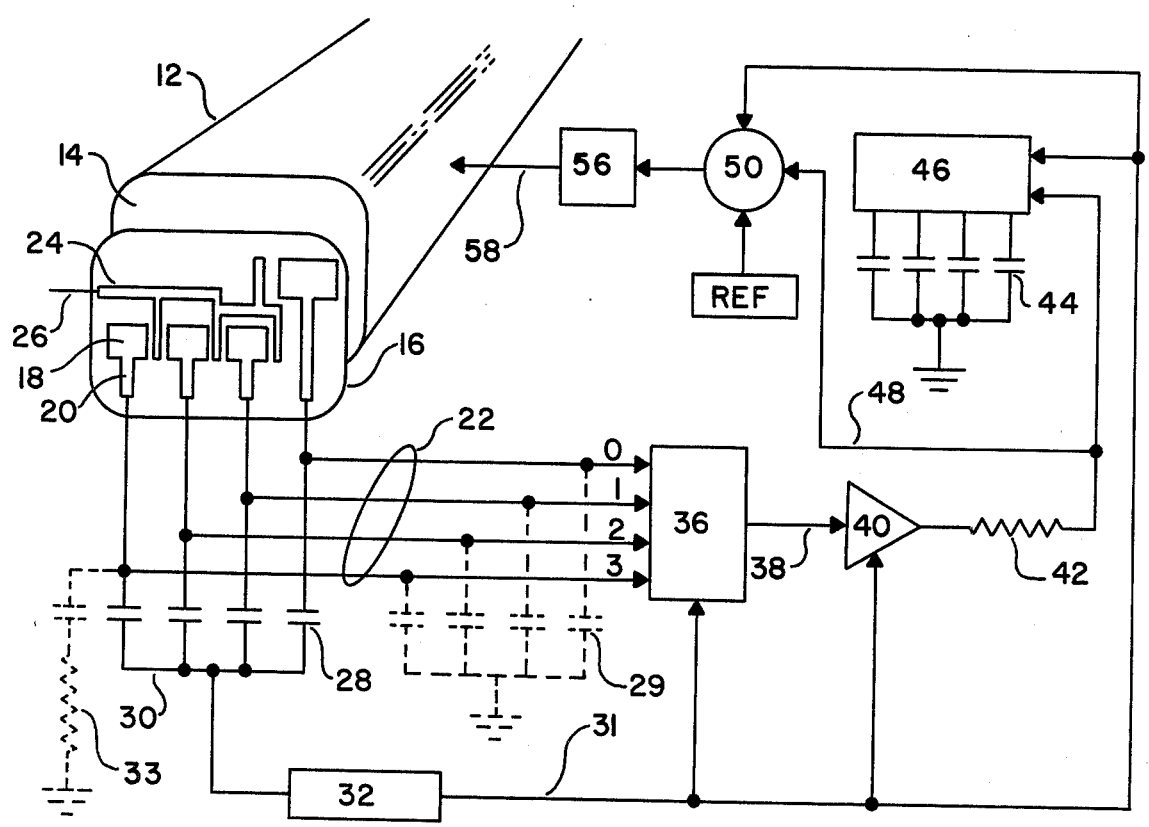
Fig-1
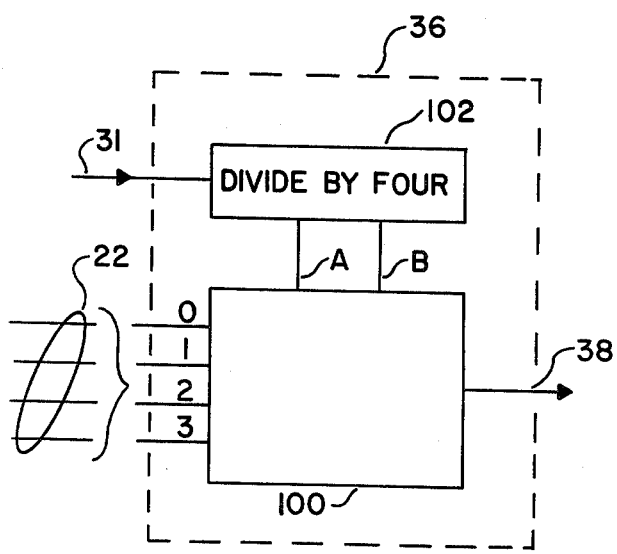
Fig-2
| INPUTS | | CHANNEL |
|---|---|---|
| A | B | ON |
| L | L | 0 |
| L | H | 1 |
| H | H | 2 |
| H | H | 3 |
Fig-3

TOUCH DISPLAY TO DIGITAL ENCODING SYSTEM

BACKGROUND OF INVENTION

Heretofore, means for feeding data to a system by using means responsive to touch connected to a data input of a data processing system in such a manner that the data displayed may be altered under the control of the data processing system is known. For example, in U.S. Pat. No. 3,482,241 to E. A. Johnson there is disclosed a plurality of touch-sensitive contacts including a transparent screen placed adjacent the screen of a cathode-ray tube, which may be selectively actuated for indicating which portion of the image on the cathode-ray screen is to be examined in further detail. When activated, data indicating which sensitive contact is touched is applied to a computer or the like where it is used typically, to control the display device.

This type of prior art touch display generally includes an aggregation of elements necessary to create it, thereby making them quite complex and detailed, hence making the system quite expensive. In addition, noise characteristics may be such that it is impossible to distinguish the actual signals from background noise. Also, the aggregation of elements may introduce reliability problems.

Another type of known prior art which relates specifically to touch sensitive cathode-ray tube switches is the switch described in U.S. Pat. No. 3,958,239 to R. E. Green. This patent teaches that touch sensitive contact pads comprise a series of areas in a matrix across the screen of a cathode-ray tube. The matrix, in turn, is coupled to a diode matrix for decoding purposes. Following decoding, which decodes the coordinates of the matrix area touched, the system incorporates a computer or the like responsive to the decoded output which is unique to the display device or cathode-ray tube for controlling this system. Here again, a disadvantage is that an aggregation of elements necessary to create the system makes the system expensive. Additionally, this system, as well as the previously mentioned system, suffers from the fact that voltage offset errors are present. This is an extremely important parameter when it is desired to operate on an analog signal under direction of a logic signal. Also, the latter system is not noise immune.

SUMMARY OF THE INVENTION

In accordance with the present invention, transparent contact pads are deployed across a transparent panel. This panel can be overlayed over a display. Each contact pad has a lead connected to state of the art electronic recognition circuitry. When a contact pad is touched, information on signal level in each pad is synchronously multiplexed into appropriate level recognition circuitry, thus information on the location of the touch contact pad is encoded. The encoded information is subsequently synchronously rectified and filtered to reduce the electrical noise and provide the data as a voltage level. A comparator synchronously senses these voltage changes or levels and the digitization process is complete. The digitized data is, of course, utilized to control the system.

It is therefore an object of the present invention to provide an improved touch display system which overcomes the disadvantages of the prior art.

It is another object of the present invention to provide a touch display to digital encoding system which is extremely reliable and which is noise immune.

It is yet another object of the present invention to provide a touch display to digital encoding system which is extremely simple, inexpensive, and which is of aesthetic value.

It is still yet another object of the present invention to provide a touch display to digital encoding system for use with an oscilloscope or the like which replaces switches and rotatable knob devices.

The foregoing and numerous other objects and advantages of the present invention will become apparent as the same is more fully understood from the following description; it is to be understood, however, that the described embodiments are not intended to be exhausting nor limiting of the invention, but are given for purposes of illustration in order that others skilled in the art may fully understand the invention and principles thereof and the manner of applying it in particular use so that they may modify it in various forms, each as may best be suited to the conditions of the particular use.

DESCRIPTION OF DRAWINGS

In the drawings, wherein like reference letters or numerals refer to like elements:

FIG. 1 is a block diagram of one embodiment of the present invention used to input electrical data into an instrument by touching a panel with a finger, in given locations;

FIG. 2 is a block diagram of a typical state of the art CMOS multiplexer used in the FIG. 1 embodiment;

FIG. 3 is a functional table for the CMOS multiplexer according to FIG. 2;

DETAILED DESCRIPTION OF THE INVENTION

Figure 4:
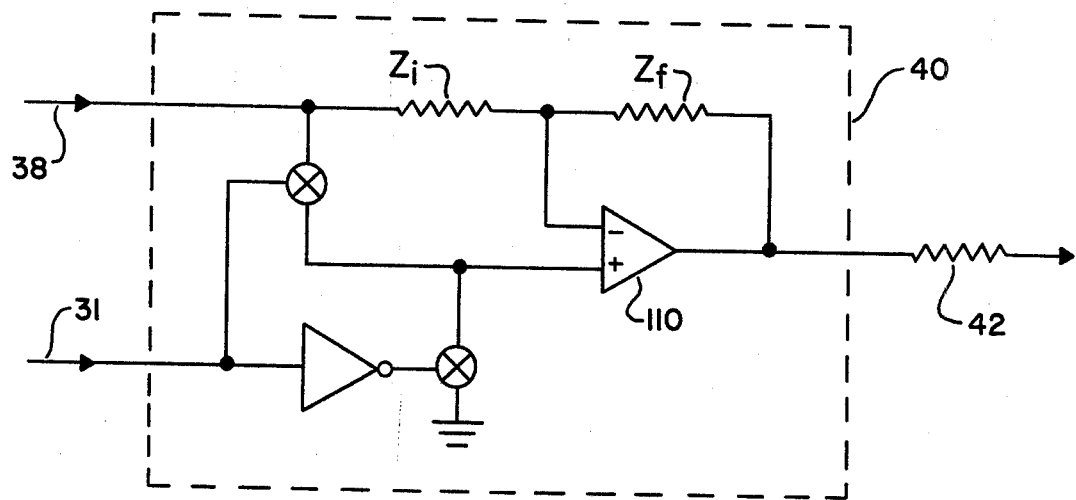
FIG. 4 is a simplified analog-inverting circuit schematic of a typical convertor used in the FIG. 1 embodiment.

Referring now to the drawings, and in particular to FIG. 1, there is shown a first embodiment of the system in accordance with the present invention. This embodiment, which is mostly in block diagram form, includes an energy emission device 12 having means 14 for emanating the energy of the device 12. Device 12 may be, for example, a cathode-ray tube (commonly referred to as a CRT) for displaying visual images generated by applying applicable signals thereto and viewing the images on the face of the cathode-ray tube. (The device could be < flat electroluminescent panel, gas-discharge panel, liquid crystal panel, computer terminal, etc.) The image is, of course, created in a cathode-ray tube when an electron beam is caused to strike a phosphor-covered screen or other energy emission substance or material. As the construction and operation of a cathode-ray tube is well known, no further discussion thereof is believed necessary. However, for those who desire additional information, a series of books generally titled "Circuit Concepts" copyrighted by the assignee of the subject invention are hereby incorporated by reference.

A plate 16 of a transparent insulating material is preferably deployed adjacent the means 12. Embedded in plate 16 and either flush with the surface thereof, or projecting slightly therefrom are a plurality of transparent contact pads 18. The contact pads 18 are preferably tin oxide and each connects to a respective transparent portion 20. The portion 20 merely connects each contact 18 to a respective conductive lead 22 each of which is applied to electric or electronic recognition circuitry to be discussed elsewhere in the description.

Optionally disposed about the contact pads 18, and in isolating relationship thereto, is an isolating or ground electrode 24 which connects to a conductive lead 26. Conductive lead 26, in turn, connects to a source of, say, steady state or variable exitation not shown. This isolating or guard electrode can be also embedded in plate 16 and either flush with the surface thereof, or projecting slightly therefrom, and is a transparent conductive portion. The purpose and operation of the electrode 24 will also be considered elsewhere in this description.

Electrically connected to each conductive lead 22 is a reactive element such as the capacitors 28. The capacitors 28 are commonly coupled along conductive lead 30, which carries an alternating or variable exitation signal generated by a signal source 32. In addition to the capacitors 28, there are shown capacitors 29, which have been drawn as dash components to signify the phantom capacitance of the contact pads 18, and a series connected resistor 33 and capacitor 34 which exist only when provided by one's body, i.e., the finger of the individual who touches one of the contact pads 18.

The signal source 32 should generate a signal, for application along the line 30 and a line 31; the signal can be formed as a relative square-wave signal. The criteria for this signal is that it should be of and have sufficient amplitude and frequency to operate the components of the invention described or to be described. A waveform generator, say, comprising an operational amplifier comparator, together with an integrator, comprises a typical circuit which could be used to generate the required square waves. As such a circuit is well known, or which can be found in "Integrated Electronics Analog and Digital Circuits and Systems" by Millman & Halkins, copyrighted 1972 by McGraw-Hill, Inc., no further discussion thereof is believed necessary.

As previously mentioned, the conductive leads 22 are coupled to electric or electronic recognition circuitry, preferably CMOS technology devices. The recognition circuitry includes a multiplexer 36 which is adapted to be utilized as a means of transmitting several information units applied thereto over a single lead such as the conductive lead 38. Multiplexer 36 is better shown in FIG. 2 and is seen to comprise a device 100 such as, for example, a commercially available Texas Instruments TF 4052B analog multiplexer or comparable device. The device is a 4-channel multiplexer having two binary control inputs (A and B) which selects one of four channels in accordance with the function table illustrated in FIG. 3. It should be mentioned that the applicants do not wish to be limited to any particular devices and the example is only given for the purposes of illustration where only four contact pads 18 are shown. Clearly any number of contact pads could be used, hence the selected multiplexer would have to provide the necessary corresponding channels.

Continuing, the binary control inputs (A & B) can be provided by device 102 such as a divide-by-four (divide-by-N) for a different number of contact pads) (two-bit counter which is synchronously initiated and clocked by the signal on the line 31 obtained from the signal source 32. As these binary counters are well known, no further discussion thereof is believed necessary.

The signal on conductive lead 38, which signal will hereinafter be referred to as information units, is next applied to a synchronous amplifier 40 best described by reference to FIG. 4. Basically, the circuit is a rectifier. The rectifier includes an operational amplifier 110 with conventional feedback elements $Zf$ and input element $Zi$. In the preferred embodiment, the gain of this amplifier is plus and minus 1 as soon to be discussed. Additionally the amplifier is made synchronous by applying the signal on the line 31 obtained from the signal source 32 to the amplifier 110. (See "CMOS Switch Inverts Analog Signal Under Control of Digital Logic", Electronic Design 25, Dec. 6, 1975.)

Figure 5:
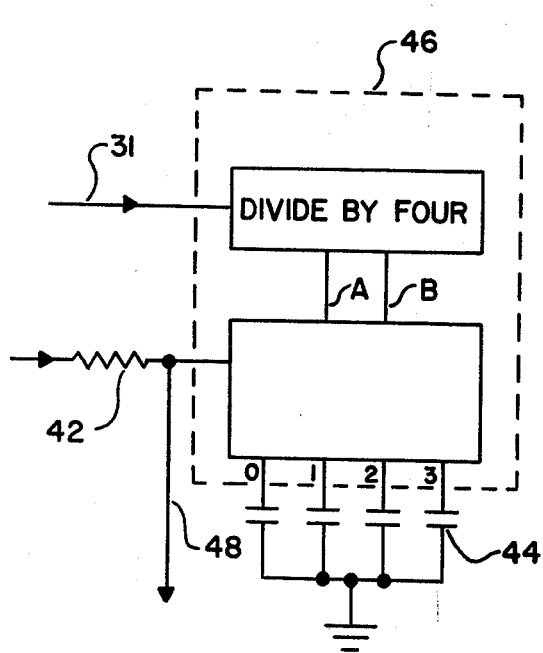
FIG. 5 is a block diagram of a typical demultiplexer used in the FIG. 1 embodiment.

Following rectification of the information units via amplifier 40, such units are applied to a series resistor 42 followed by shunt capacitances 44. This network forms the simplest of forms used to lower the ripple content of the rectified signal. One difference between the simple RC circuit and the circuit in accordance with the present invention is, however, that capacitors 44 are connected in shunt with the resistor 42 through a second multiplexer 46 connected as a demultiplexer. Thus, an equivalent of an array of synchronously switched quadrature filters is formed, each capacitor 44 corresponding to one quadrature filter. (See FIGS. 3 and 5 and "Get notch Qs in the Hundreds," Electronic Design 16, Aug. 2, 1974, for a detailed analysis of a communicative filter.)

The filtered output is then supplied via a conductive lead 48 to a circuit 50 which conventionally compares the level of this output with a reference signal. Any difference between the level and the reference signal is therein synchronously detected and this difference or comparison is data which can be recognized and utilized by microprocessor, computer, or the like as indicated by 56. The output of 56 is typically used to control or set up the display via the data control line 58.

Figure 6:
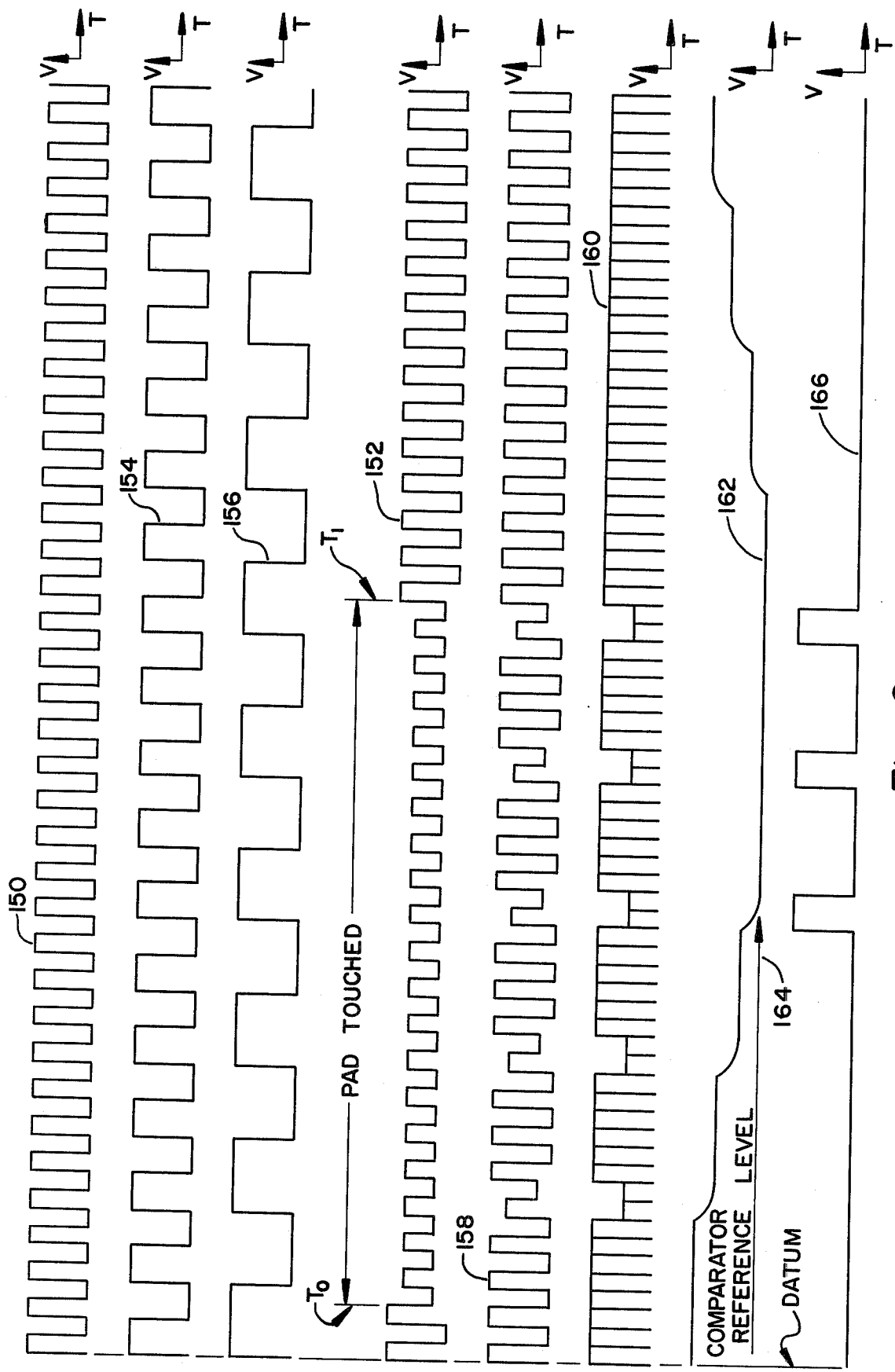
FIG. 6 is a timing diagram of the signals generated within the system of FIG. 1 and is provided for purposes of explanation of the system operation.

Having described the "hardware" of the system according to the present invention, the operation thereof will now be considered. However, before the operation can be considered, it is first necessary to assume a few initial conditions. Assuming that the device 12 is a CRT of a conventional oscilloscope or other oscillographic device, it is known that such a device includes external operating controls such as switches for, say, selecting or choosing one of a plurality of inputs signals and further extending this choice as to whether a direct connection (DC) or a capacitive coupling (AC) from the input to an amplifier is provided. Therefore, according to the present invention, two of the contact pads 18 could replace the discussed switches which simplifies the design of the oscilloscope making it less expensive and improving the aesthetics thereof. Continuing, the exitation signal of, say, 10 kilohertz, generated by signal source 32 is applied across the capacitors 28 and 29. If capacitors 28 and 29 are identical, a voltage is developed on the conductive leads which is about one-half the amplitude of the exitation signal. Under these conditions, the system is stable and no changes occurs. It should be mentioned at this time that the guard electrode 24 is utilized to insure that the capacitors 28 are equal by preventing distributed capacitance between pads to be a problem. However, when a contact pad is touched by human finger, human body capacitance (approximately 100 picofarads) shunts the capacitor 29 associated with one of the conductive leads 22. Accordingly, the exitation signal is shunted and the voltage level on the associated conductive lead is reduced. Information on signal level of the contact pad is then synchronously multiplexed via the multiplexer 36. This operation is depicted in FIG. 6 wherein is shown a plurality of time related graphs. In the graph, waveform 150 represents the exitation signal supplied across the capacitors 28 and 29 and which is also available along the line 31 whereas waveform 152 represents the information units associated with one of the conductive leads 22. If, at a time $T_0$, the conductive pad is touched, the amplitude of the waveform 152 for the duration the pad is in contact with body capacitance, say until the time $T_1$ is decreased. At time $T_1$, the amplitude of the waveform 152 returns to the quiescent level. Waveforms 154 and 156 represent respectively, the signals A and B divided or counted down from the waveform 150 within multiplexer 36. Therefore, in accordance with the functional table given in FIG. 3, the signal appearing on conductively 38 is the waveform 158. Since the contact pad is synchronously multiplexed, only one of every four of the decreased amplitude signal or pulses is available at the input to the filter. Correspondingly, waveform 158 is treated to rectification by amplifier 40 to provide the waveform 160. Waveform 160, in turn, is synchronously filtered in passing through the resistor 42 and shunt capacitance 44 in accordance with the demultiplexing by the multiplexer 46 in accordance with FIG. 3 and 5 to provide on the capacitance 44 the waveform 162. Associated with waveform 162 is a line 164 which represents the quiescent level or reference signal used by the comparator 50. Comparator 50 therefore, synchronously compares the level of the waveform 162 to the voltage level represented by line 164. Between the intervals $T_0$ and $T_1$, comparator 50 senses a cumulative difference in levels and an output therefrom is provided. This output, waveform 166 is coupled to means 56 to alter the display in accordance with preset conditions. The length or period of time required for the comparator to sense that a pad is touched depends upon the time constant of the resistor 42 and capacitors 44. Thus, in the example, when the contact pad is touched, as indicated by the presence of the resistance 33 and capacitor 34, waveform 166 is a digital encoded word which the means 56 recognizes to effect the necessary changes.

Clearly, the objects and advantages of the present invention have been fulfilled as what is provided is a touch display to digital encoding system which synchronously converts data to discrete elements of information.

Figure 7:
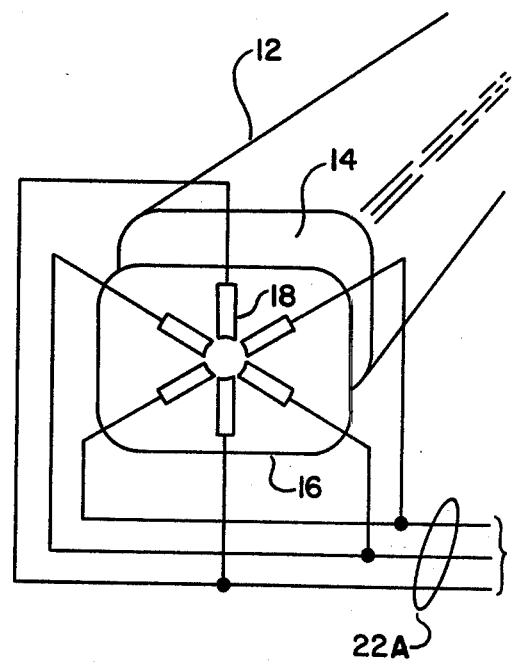
FIG. 7 is another partial embodiment of the present invention which may be utilized to replace rotatable knobs.

Referring now to FIG. 7 there is shown another embodiment of a portion of the invention. In this configuration, the contact pads are intended to be used in a fashion which simulates potentiometers. The contact pads 18 have been arranged in a circle but the array could be arranged linearly. By moving the body capacitance of the finger across the array, the signal is generated as described previously, but this signal corresponds to the direction and velocity of the finger movement which enables continuous functions to be generated. In the embodiment shown i.e., a configuration of three end pads, every third pad is electrically connected together.

Thus a three phase clock is formed where both direction and speed of finger movement is encoded. Clearly the capability of the continuous function as implemented with no moving parts is an advantage over the prior art.

While there have been shown and described various embodiments of the present invention, it will be apparent to those skilled in the art that many changes and modifications may be made without departing therefrom in its broader aspects. For example, using the techniques described it would be possible to provide analog information representing a continuous signal by providing the contact pads as a continuous portion and having means for detecting the position of a finger as the finger is slid along the path. Additionally, it is possible to directly input positional data into the system by providing, say, a plurality of coded contact pads whereby when a finger is placed across a plurality of pads, a code is automatically generated. Other possibilities also exist, such as overlaying the contact panel on top of two displays already overlayed i.e., a stack such as a CRT faceplate plus transparent liquid crystal panel plus CRT faceplate. Therefore, the appended claims are intended to cover all such modifications and changes that fall within the true spirit and scope of the invention.

The invention is claimed in accordance with the following:

1. A touch display to digital encoding system, comprising:
   display means including means for providing light images;
   means associated with said display means for inputting N data units thereto, said means including touch contact means sensitive to touching by a human body for providing N data units;
   electronic recognition circuitry responsive to said N data units for synchronously converting said N data units to discrete elements of information to digitally encode said N data units, said circuitry comprising
   (a) first means for selecting one out of said N data units and transmitting the selected data unit to a single channel, said first means including means for synchronously selecting said data unit;
   (b) second means responsive to said data unit for providing a signal which is a synchronous rectified version of said data unit, said second means including unity gain amplifier means for rectifying said data unit;
   (c) third means responsive to said signal for sychronously providing a filtered signal, said third means including synchronously switched means for filtering said signal;
   (d) means for comparing said filtered signal and a reference signal to provide said discrete elements of information; and
   means responsive to said discrete elements of information for providing control data, said means also being operatively associated with said display means for inputting said N data units thereto.

2. The system according to claim 1 wherein said display means is a cathode-ray tube and said means for providing light images is a viewing screen adapted to be responsive to said light images for providing a visually observable image.

3. The system according to claim 1 wherein said first means defines a multiplexer.

4. The system according to claim 1 wherein said third means defines a demultiplexer.

* * * * *